United States Patent [19]

Matsuno et al.

[11] Patent Number: 5,034,372
[45] Date of Patent: Jul. 23, 1991

[54] PLASMA BASED METHOD FOR PRODUCTION OF SUPERCONDUCTIVE OXIDE LAYERS

[75] Inventors: Shigeru Matsuno; Yoshio Kubo; Kiyoshi Yoshizaki; Mitsunobu Wakata; Syouji Miyashita; Fumio Fujiwara, all of Amagasaki, Japan

[73] Assignee: Mitsubishi Denki Kabushiki Kaisha, Tokyo, Japan

[21] Appl. No.: 281,044

[22] Filed: Dec. 7, 1988

[30] Foreign Application Priority Data

Dec. 7, 1987 [JP] Japan .................. 62-310435
Dec. 17, 1987 [JP] Japan .................. 62-322168

[51] Int. Cl.$^5$ .................. B05D 5/12; B05D 3/06
[52] U.S. Cl. .................. 505/1; 505/734; 505/737; 505/740; 427/62; 427/39; 427/314; 427/421; 427/126.3; 427/38; 427/57; 427/120
[58] Field of Search .................. 427/62, 63, 38, 39, 427/226, 57, 421, 314, 126.3; 505/1, 737, 734, 740

[56] References Cited

U.S. PATENT DOCUMENTS

| | | | |
|---|---|---|---|
| 3,840,391 | 10/1974 | Spitz et al. | 427/57 |
| 4,507,643 | 3/1985 | Sunano et al. | 338/34 |
| 4,571,350 | 2/1986 | Parker et al. | 427/109 |
| 4,717,584 | 1/1988 | Aoki et al. | 427/38 |

OTHER PUBLICATIONS

Gurvitch et al., "Preparation and Substrate Reactions of Superconducting Y-Ba-Cu-O Films", Appl. Phys. Lett. 51(13) Sep. 1987, pp. 1027-1029.
Koinuma et al., "Some Problems in the Preparation of Superconducting Oxide Films on Ceramic Substrates", Jpn. J. Appl. Phys. 26(5) May 1987, L763-765.
Osofsky et al., "Experimental Program on High Tc Oxide Superconductors at the Naval Research Laboratory", MRS Apr. 1987, pp. 173-175.
Prakash "Thin Film Studies of Oxides by the Organometallic-CVD Technique", Prog. Crystal Growth and Charact. vol. 6, 1983, pp. 371-391.
Meng et al., "High Tc Superconducting Thin Films by Chemical Spray Deposition", Int. J. Mod. Phys. B. vol. 1(2) Jul. 1987, pp. 579-582.
Kawai et al., "Formation of Y-Ba-Cu-O Superconducting Thin Film by a Spray Pyrolysis Method", Jpn. J. Appl. Phys. vol. 26 (10) Oct. 1987, L1740-1742.
Physical Review Letters vol. 58, No. 9, Mar. 2, 1987, pp. 908-910; M. Wu, et al.

Primary Examiner—Norman Morgenstern
Assistant Examiner—Roy V. King
Attorney, Agent, or Firm—Oblon, Spivak, McClelland, Maier & Neustadt

[57] ABSTRACT

An improved method for producing superconductive oxide substance, wherein a solution containing therein a plurality of elements to constitute the superconductive oxide substance is atomized into mists, then the thus atomized mists are transported on a carrier gas into a chemical reaction device, and, after the chemical reaction in this chemical reaction device, the superconductive oxide substance is deposited on a substrate in a desired shape, with further heat-treatment of the thus deposited superconductive oxide substance in an oxygen-containing atmosphere at a temperature ranging from 200° C. to 1,200° C.

A method for producing superconductive oxide powder, wherein a solution containing therein a plurality of elements, which have been blended in a manner to exhibit the superconductive property by heat-treatment, is atomized into mists, then the atomized solution of the superconductive substance is heat-treated, and the resultant finely divided substance as heat-treated is separated and collected.

2 Claims, 5 Drawing Sheets

PLASMA BASED METHOD FOR PRODUCTION OF SUPERCONDUCTIVE OXIDE LAYERS

BACKGROUND OF THE INVENTION

1. FIELD OF THE INVENTION

This invention relates to a superconductive oxide substance which can be used as the wire material for superconductive coil to generate high magnetic field and so forth, and also to a method for producing powder of such superconductive oxide substance.

2. DISCUSSION OF BACKGROUND

In recent years, there has been high demand for the superconductive coils, magnetic shielding materials, high frequency cavity resonators, etc. of low operating cost in the field of magnetically levitated train, high energy physics, nuclear magnetic resosnance apparatus, material property researches, and so on. Since the conventional superconductive coil has been manufactured in such a way that a superconductive wire made of an alloy having a low critical temperature, such as, for example, NbTi (having a critical temperature Tc of approximately 10 K.) or intermetallic compounds such as, for example, $Nb_3Sn$ (having Tc of approx. 18 K.) is wound on a coil winding frame, the superconductive coil as produced had to be operated at a temperature of liquefied helium (4.2 K.). On account of this, high cost would inevitably incur to the cooling operation, which, in turn, redered the operating system complicated. In 1987, however, a superconductive oxide substances having a very high critical temperature of 100 K. or above were discovered, which made it possible to operate the superconductive coil at a temperature of liquefied nitrogen (77 K.). This superconductive substance is an oxide of a composition represented by $(Ba_{0.6}Y_{0.4})_2CuO_4$. The superconductive oxide is produced by mixing $BaCO_3$, $Y_2O_3$, and $CuO$, all being in powder form, shaping the mixture in a desired shape, and thereafter heat-treating the shaped article. The technique in this field is introduced in a periodical: Phys. Rev. 58 (1987), pp 908 to 910.

On the one hand, the superconductive wire to be used for the conventional superconductive coil is required to be a long continuous line, and to have a stable and excellent superconductive property in the longitudinal direction. However, since the superconductive oxide substance having a high critical temperature (Tc) belongs to ceramic which is very brittle, it is difficult to manufacture a long continuous wire with the conventional technique. On account of this, the effective way of producing the wire material for the superconductive coil is to deposit such superconductive substance on a long tape or fiber as the substrate by means of the chemical vapor deposition method (hereinafter abbreviated as "CVD"). However, due to absence of the materials having appropriate vapor pressure required to carry out the CVD, the desired CVD method could not be effected. Accordingly, the problem still remains in obtaining the superconductive oxide coil having a long length.

On the other hand, the superconductive wire to be used for the superconductive coil, for example, is required to have a high critical current density (Jc). For this purpose, the powder material for sintering is required to have accurate chemical composition, small particle diameter, and uniform distribution of the particles. With the conventional technique, however, since the difference in composition and particle size distribution are so extensive that the sintered bodies having low critical current density could only be obtained.

SUMMARY OF THE INVENTION

It is therefore an object of the present invention to provide a method for producing the superconductive oxide substance which can be made sufficiently long and excellent in its various properties.

It is another object of the present invention to provide a method which is capable of producing the superconductive oxide substance having high critical current density.

It is other object of the present invention to provide a method for producing superconductive oxide powder which can be used as the material for manufacturing the sintered body having high critical current density.

According to the present invention, in one aspect thereof, there is provided a method for producing superconductive oxide substance, which comprises steps of: atomizing into mists a solution containing therein a plurality of elements consituting the superconductive oxide substance; transporting the thus atomized mists on a carrier gas into a chemical reaction zone; and, after the chemical reaction in said chemical reaction zone, deposition said superconductive oxide substance on a substrate in a desired shape.

According to the present invention, in another aspect thereof, there is provided a method for producing superconductive oxide substance, which comprises steps of: atomizing into mists a solution containing therein a plurality of elements constituting the superconductive oxide substance; transporting the thus atomized mists on a carrier gas into a chemical reaction zone; after the chemical reaction in said chemical reaction zone, deposition said superconductive oxide substance on a substrate in a desired shape; and heat-treating the thus deposited superconductive oxide substance in an oxygen-containing atmosphere at a temperature ranging from 200° C. to 1,200° C.

According to the present invention, in other aspect thereof, there is provided a method for producing superconductive oxide powder, which comprises steps of: finely dividing by atomization a solution containing therein a plurality of elements which have been blended in such a manner as to exhibit the superconductive property through heat-treatment; heat-treating said finely divided solution of the superconductive substance; and separating and collecting said finely divided substance as heat-treated.

The foregoing objects, other objects as well as specific process conditions for manufacturing the superconductive oxide substance according to the present invention will become more apparent and understandable from the following detailed description thereof, when read in conjunction with the accompanying drawing illustrating a few preferred examples of apparatus to be used for such production.

DETAILED DESCRIPTION OF THE PREFERRED EMBODIMENTS

In the following, the method for production of the superconductive oxide substance according to the present invention will be described in detail in reference to the accompanying drawing.

Figure 1:
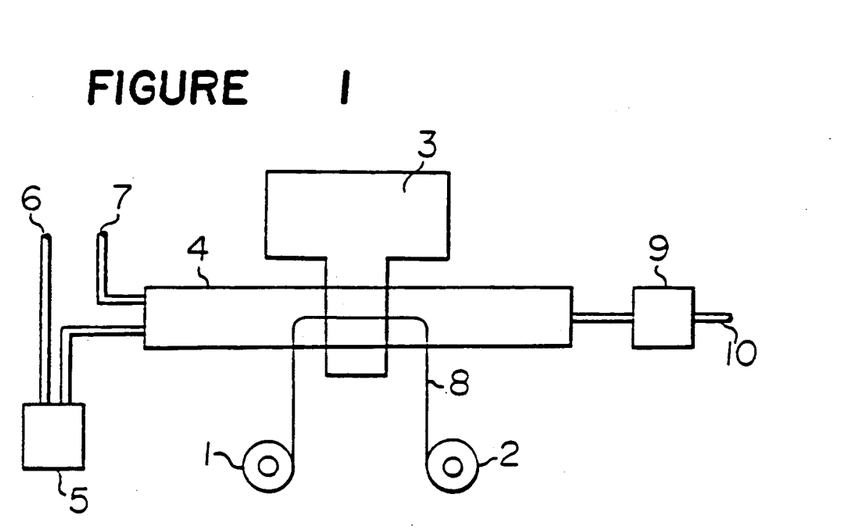
FIG. 1 is a schematic structural diagram showing a production device for the superconductive oxide substance according to one embodiment of the present invention.

FIG. 1 shows a general construction of a system for producing a superconductive thin strap made up of superconductive oxide substance according to one embodiment of the present invention. In this case, a device which makes used of the oxygen-containing plasma excitation reaction, i.e., a plasma CVD device, is used as the chemical reaction device; a supersonic atomizer is used for atomization of solution containing therein a pluratlity of elements constituting the superconductive oxide substance; and stainless steel plate is used as the substarate.

In the drawing, a reference numeral 1 designates a feeding reel of the stainless steel substrate; a numeral 2 refers to a take-up reel of the resulting superconductive thin strap; a reference numeral 3 represents a plasma-generating micro-wave power source; a reference numeral 4 denotes a reaction chamber; a reference nurmeral 5 designates a supersonic atomizer for forming atomized mists of the material solution; a numeral 6 refers to a feeding port of oxygen which transports the atomized mists of the material solution to the reaction chamber 4 as the carrier gas and also functions as the oxidizing gas for the atomized solution; a numeral 7 refers to a feeding port of the oxidizing gas for controlling a partial pressure of oxygen gas in the reaction chamber 4 independently of the feed rate of the atomized mists of the material solution; a reference numeral 8 designates the superconductive thin strap as manufactured; a reference numeral 9 denotes a gas discharging pump; and a numeral 10 refers to a gas discharge port. The micro-wave plasma CVD device is constructed with the plasma-generating micro-wave power source 3, the reaction chamber 4, and the gas discharge pump 9.

Figure 2:
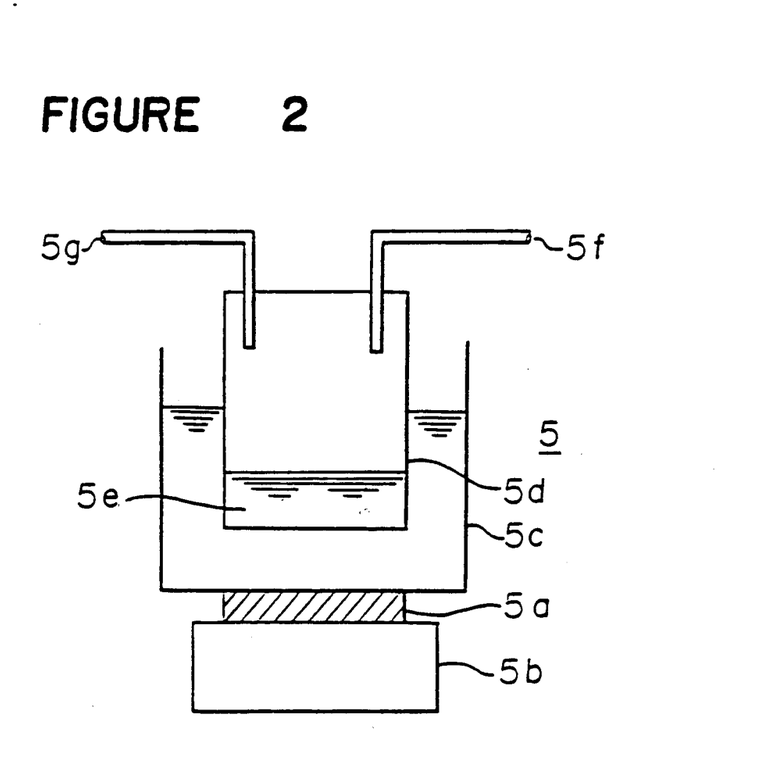
FIG. 2 is a schematic structural diagram in cross-section showing a supersonic atomizer constituting a part of the device shown in FIG. 1.

FIG. 2 is a schematic structural diagram in cross-section, showing, in detail, the supersonic atomizer 5 shown in FIG. 1. In the drawing, a reference numeral 5a designates a supersonic vibrating element; a numeral 5b refers to a power surce for driving the supersonic vibrating element; a reference numeral 5c denotes a water bath; 5d represetns a vessel for the material solution; 5e designates the material solution; 5f a feeding port for the carrier gas; and 5g an outlet prot for the atomized mists of the material solution.

Supersonic wave is generated by actuating the supersonic vibrating element 5a with a high frequency electric power of 1.6 MHz, 35 W from the supersonic vibrating element driving power source 5b, the supersonic wave of which propagates in and through the water bath 5c to vibrate the material solution 5e, whereby the material solution is atomized to form very fine mists having a diameter of from 2 to 5 $\mu$m. The thus atomized mists are discharged from the outlet 5g by being carried on oxygen gas introduced from the inlet port 5f for the carrier gas. While the transporting quantity of the atomized mists of the material solution differs more or less according to the class of solvent used in the material solution, it is proportional to the flow rate of the carrier gas, which was approximately 300 cc/hr when the gas flow rate was 200 SCCM.

The atomized mists of the material solution discharged from the supersonic atomizer 5 are then intorduced into the reaction chamber 4 in FIG. 1. At this instant, too, by introduction of oxygen from the oxidizing gas feeding port 7, the partial pressure of oxygen in the reaction chamber 4 may be controlled independently of the transporting quantity of the atomized mists. In this manner, both atomized mists of the material solution and oxygen gas which have been introduced into the reaction chamber 4 are turned into plasma by the micro-wave of 2.45 GHz to be generated from the plasma-generating micro-wave power source 3, and are simultaneously deposited on the stainless steel substrate which has been pre-heated by the micro-wave. When the micro-wave output was 200 to 700 W, the temperature of the substrate was in a range of from 400 to 1,000° C. In this case, the stainless steel substrate is in the form of a strap or tape having its width of 100 mm and its thickness of 0.1 mm, which is successively forwarded at a constant speed of 1 to 6 m/hr into the reaction chamber 4, wherein it is redered a superconductive thin strap 8 with the superconductive oxide substance having been deposited on it. By the way, the gas filled in the reaction chamber 4 is purged through the discharge port 10 by means of the discharge pump, whereby its interior is maintained at a vacuum degree of from 5 to 20 Torr, at which the plasma formation is facilitated. Through a series of operations as mentioned in the preceding, it is possible to continuously form the superconductive oxide thin strap with stainless steel plate as the substrate.

Figure 3:
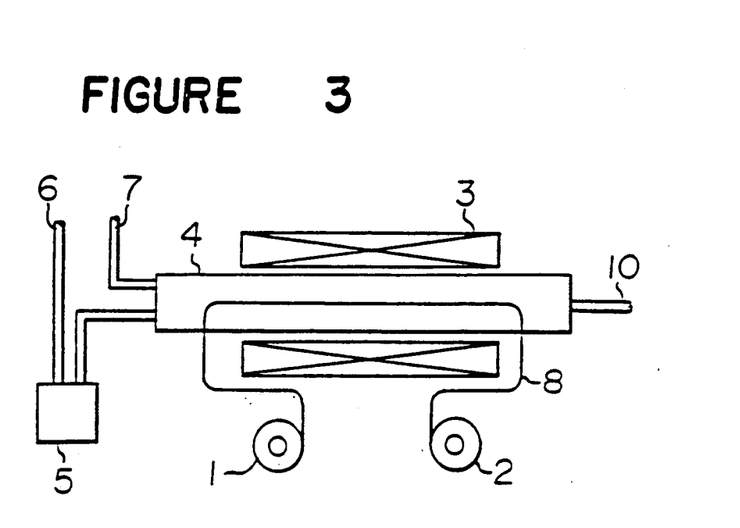
FIGS. 3 to 5 are respectively schematic structural diagram showing the production system for the superconductive oxide substance according to other embodiments of the present invention.

FIG. 3 is a structural diagram showing the production system of the superconductive thin strap made up of the superconductive oxide substance according to another embodiment of the present invention, in which a heat-decompositin type CVD device, i.e., a general heat-decomposition or heat-oxidation device incorporating therein an electric furnace is employed, instead of the plasma CVD device shown in FIG. 1. In the drawing, a reference numeral 13 designates a heater and a numeral 14 refers to a reaction tube, both of which constructs the heat-decomposition type CVD device.

The atomized mists of the material solution wich have been sent out of the supersonic atomizer 5 are introduced into the reaction tube 14 which has been heated to a temperature of from 600 to 1,200° C. by means of the heater 13, in which they are reacted with oxygen gas to be turned into very fine particles of the superconductive oxide substance, after which they are deposited on the stainless steel substrate wich is fed into the reaction tube 14 at a constant speed of, for example, 1 to 6 m/hr.

Figure 4:
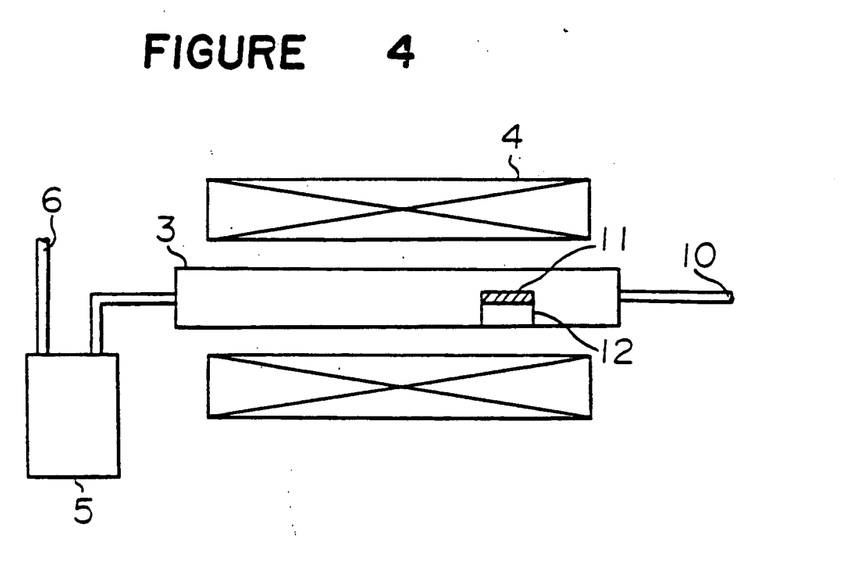

FIG. 4 is also a structural diagram showing the production device of the superconductive oxide substance according to further embodiment of the present invention, wherein use is made of the heat-decomposition type CVD device as the chemical reaction device, and the supersonic atomizer 5 shown in FIG. 2 for the atomization of the material solution. In the drawing, a reference numeral 11 represents the substrate (in this case, a monocrystalline substrate of MgO), and a numeral 12 refers to a positioning table for the substrate.

The atomized mists of the material solution which have been sent out of the supersonic atomizer 5 at a flow rate of 5 cc/hr, with an output of the supersonic atomizer 5 being 16 MHz, 10 W and the flow rate of the carrier gas being 200 SCCM, are introduced into the reaction tube 14 which has been heated to a temperature of from 600 to 1,200° C. by means of the heater 13, in which they are reacted with oxygen gas to be turned into very fine particles of the superconductive oxide substance, and then deposited in the form of film on the substrate 1 placed at the downstream part of the reaction tube 14. Exhaust gas containing therein by-products from the heat decomposition during the reaction is discharged through the gas discharge port.

Figure 5:
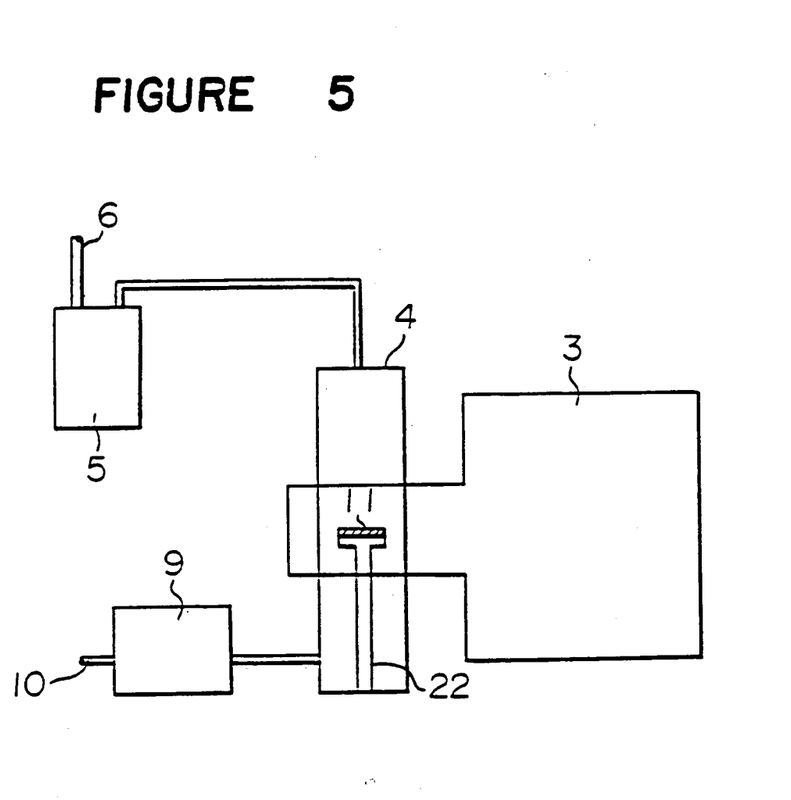

FIG. 5 is also a structural diagram showing the production device of the superconductive oxide film according to other embodiment of the present inveniton, wherein use is made of the plasma CVD device as the chemical reaction device and the supersonic atomizer 5 shown in FIG. 2 for the atomization of the material solution. In the drawing, a reference numeral 22 denotes a substrate holder. In this case, a monocrystalline substrate of $SrTiO_3$ is used as the substrate 11.

The atomized mists of the material solution sent out of the supersonic atomizer 5 are introduced into the reaction chamber 4. Both atomized mists of the material solution and oxygen gas as introduced into the reaction chamber are turned into plasma by the micro-wave of 2.45 GHz to be generated from the plasma-generating micro-wave power source 3, and, at the same time, deposited on the monocrystalline substrate of $SrTiO_3$ which has been heated with the micro-wave. By the way, when the output of the micro-wave is in a range of from 200 to 500 W, the gas within the reaction chamber 4 is completely purged through the discharge port by the gas discharge pump to thereby maintain the interior of the reaction chamber at a vacuum degree of from 5 to 20 Torr, at which the plasma formation is facilitated.

Figure 7:
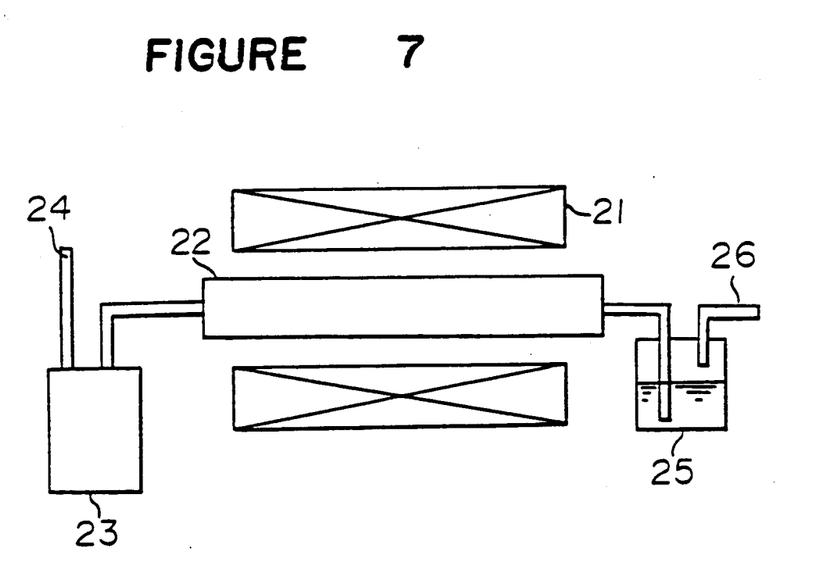
FIG. 7 is a schematic structural diagram showing the production device for the superconductive oxide powder according to still other embodiment of the present invention.

In the following, the method of producing the superconductive oxide powder will be explained in reference to FIG. 7 schematically illustrating the construction of the production device of the superconductive oxide powder according to still other embodiment of the present invention. In this embodiment, use is made of the heat-decomposition type CVD device, i.e., a general heat-decomposition or heat-oxidation reaction device incorporating therein an electric furnace, as the heat-treating device; use is made of the supersonic atomizer for atomizing solution containing therein a plurality of elements which have been blended in such a manner as to exhibit the superconductive poroperty through the heat-treatment (material solution); and the separation and collection of the resultant powder are effected by bubbling in alcohol the gas for transporting and separating the superconductive oxide powder.

In the drawing, a numeral 21 refers to a heater for heat-treatment; a reference numeral 22 designates a reaction tube; a reference numeral 23 represents an atomizer such as, for example, a supersonic atomizer to atomize the material solution into mists, which is similar to the atomizer 5 shown in FIG. 2; a numeral 24 refers to a feeding port of oxygen gas which functions to transport and separate the atomized material solution to and in the reaction tube 22, and, at the same time, to serve as the oxidiazing gas; a reference numeral 25 indicates an alcohol trap for collecting the powder; and a numeral 26 refers to a gas discharge port. The heat-decomposition type CVD device is constructed with the heater 21 for the heat-treatment and the reaction tube 22. Incidentally, this heat-treatment may be done at the site where the material solution has been atomized into mists.

Here, the construction and operation of the atomizer 23 are the same as those of the atomizer 5 shown in FIG. 2, hence explanations thereof will be dispensed with. The atomized mists of the material solution which have been sent out of the supersonic atomizer 23 are introduced into the reaction tube 22 which has been heated by the heat-treating device 21 shown in FIG. 7, wherein they are reacted with oxygen gas to be turned into the superconductive oxide powder. The thus porduced superconductive oxide powder is collected in the alcohol trap 25, and the discharge gas is let out through the discharge port 26.

With a view to enabling those persons skilled in the art to put this invention into practice, the following perferred examples are presented. It should however be understood that these examples are illustrative only and not so restrictive, and that any changes and modifications may be made by those persons skilled in the art without departing from the spirit and scope of the invention as recited in the appended calims.

EXAMPLE 1

In this example, there will be indicated the actual reaction conditions, when the superconductive thin strap of the optimum properties were obtained with use of the production system of the superconductive thin strap as shown in FIG. 1.

First of all, with a view to obtaining the superconductive oxide substance of $(Y_{0.4}Ba_{0.6})_3Cu_3O_8$ as the end product, nitrate of each and every constituent element, i.e., $Y(NO_3)_3$, $Ba(NO_3)_2$, and $Cu(NO_3)_2$, was blended to be in a compositional ratio of $Y:Ba:Cu=2:3:5$. The thus prepared mixture was dissolved into water to form an aqueous solution having an overall concentration of 0.2 mol/ , which was made the material solution. Oxygen as the carrier gas was fed at a flow rate of 100 SCCM, while oxygen as the oxidizing gas was fed at a flow rate of 200 SCCM. The degree of vacuum within the reaction chamber 4 was maintained at 20 Torr. An output from the plasma-generating micro-wave power source was 600 W, and the temperature of the stainless steel substrate at that time was 980° C. Also, the feeding rate of the substrate was 3 m/min.

The film thickness of the superconductive thin strap obtained under the above-mentioned reaction conditions was substantially uniform throughout, which was in a range of from 4 to 4.5 m. The surface of the film was dense and compact. Also, the thus obtained superconductive thin strap was measured for its critical temperature, a transition width of the critical temperature, and its critical current density (at 77 K.). The results indicated very favorable values of 96 K., 3 K. and 15 A/cm$^2$, respectively. Further, this superconductive thin strap was wound arond a cylinder having a diameter of 10 cm to observe peeling of the superconductive oxide film from the substrate and lowering in its superconductive property. No peeling of film and no lowering of the superconductive property could be seen, hence the superconductive thin strap exhibited a sufficient mechanical strength against deformation.

EXAMPLE 2

The superconductive thin strap was manufactured by means of the same production device as shown in FIG. 3. The superconductive oxide thin strap was produced by using the same material solution and the stainless steel substrate as those used in Example 1 above, finely dividing the material solution into mists by atomizing the same manner as mentioned above, then feeding the atomized mists on the carrier oxygen gas flowing at a rate of 100 SCCM, while also feeding oxygen gas for oxidization at a flow rate of 200 SCCM, into a heating furnace maintained at a temperature of 980° C. under the atmospheric pressure, and at a substrate feeding speed of 3 m/min. The superconductive property of thus obtained specimen of the superconductive oxide thin strap indicated its critical temperature, transition width, and critical current density of 94 K., 4 K., and 10 A/cm$^2$, respectively, which were all favorable for the purpose of the present invention, although the values of this specimen were somewhat inferior to those of the specimen produced by use of the plasma CVD device of Example 1 above.

EXAMPLE 3

With a view to obtaining a superconductive oxide substance of $YBa_2Cu_2O_{7-\delta}$ as the end product, acetate of each and every constituent element, i.e., $(CH_3COO)_3Y$, $(CH_3COO)_2Ba$, and $(CH_3COO)_2Cu$ was blended so as to be at a compositional ratio of Y:Ba:Cu=1:2:3. Then the thus obtained mixture was dissolved in water to prepare an aqueous solution having an overall concentration of 0.2 mol/ , which was made the material solution. Using this material solution, a superconductive thin strap of the superconductive oxide substance was produced under the same conditions as in Examples 1 and 2 above. The superconductive property of the thus obtained specimen was almost equal to that of Examples 1 and 2.

EXAMPLE 4

The specimens produced in Examples 1, 2 and 3 above were subjected to heat-treatment in an oxygen atmosphere at a temperature ranging from 200 to 1200° C. and for a time period of from 1 to 4 hours (in this case, at 920° C. for one hour). The thus heat-treated specimens were compared with those of Examples 1 to 3 for the surface shape, the critical temperature, and the transition width of the critical temperature. It was found that they are all substantially same as those in the previous examples, with the exception that the critical current density improved by 20 to 30%.

EXAMPLE 5

With a view to obtaining a superconductive oxide substance of $(La_{0.4}Sr_{0.6})_2CuO_4$, nitrate of each and every constituent element was weighed so that the compositional ratio of La, Sr and Cu might be 4:6:5, followed by dissolving the mixture in water to prepare an aqueous solution having an overall concentration of 0.2 mol/ , which was made the material solution. Using this material solution, the superconductive thin strap was produced under the same conditions as in Example 1 above on a stainless steel tape and molybdenum and alumina fibers, respectively, as the substrate. The thus obtained superconductive oxide exhibited the substantially same superconductive property, irrespective of difference in the substrate used, and their critical temperature, transition width of the critical temperature, and their critical current density were 45 K., 2 K. and 10 A/cm$^2$, respectively.

EXAMPLE 6

Figure 6:
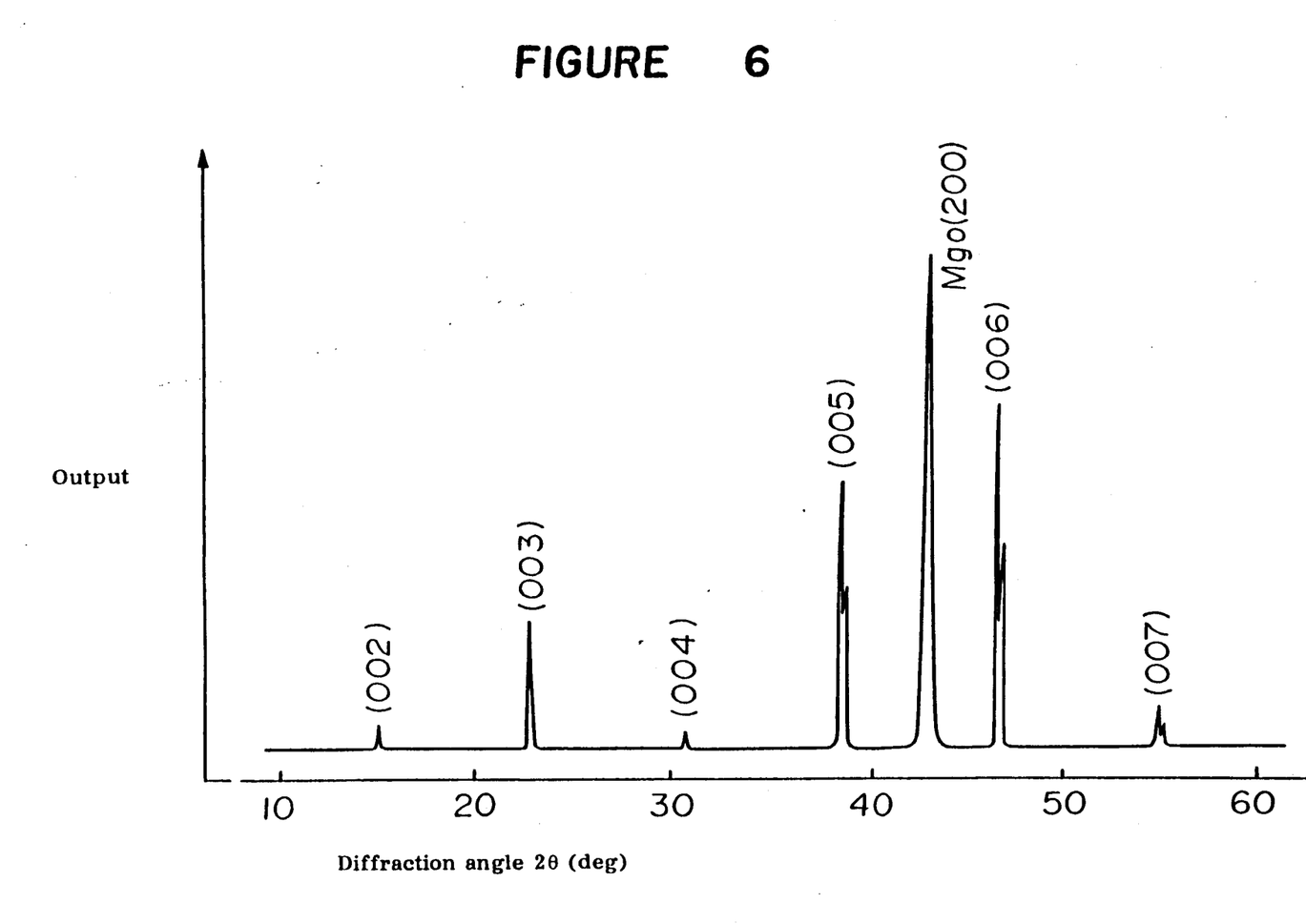
FIG. 6 is an X-ray diffraction pattern of an oriented film of the superconductive oxide substance obtained in accordance with one example of the present invention.

With a view to obtaining a superconductive oxide of $YBa_2Cu_3O_{7-\delta}$ as the end product, the same material solution as in Example 3 above was prepared, and a superconductive oxide film was produced by means of the superconductive film producing device shown in FIG. 4. As the substrate, use was made of a monocrystalline substrate of MgO which had been mirror-polished to a surface coarsenes of 1 $\mu$m or below. The material solution was finely divided into samll mists by atomizing it in the same manner as in the foregoing examples, and then transported on a carrier oxygen gas flowing at a rate of from 20 to 400 SCCM into a heating furnace maintained at a temperature of 600 to 1,200° C. (in this case, at 920° C.) and the reaction was conducted under the atmospheric pressure for a time period of from 1 to 4 hours (in this case, one hour), thereby forming the superconductive oxide film on the substrate. Immediately after the formation of the superconductive oxide film, it was subjected to heat-treatment in an oxygen atmosphere at a temperature ranging from 200 to 1,200° C. and for a time period of from 1 to 6 hours (in this case, at 920° C. for one hour). By the above-described process steps, there was obtained the superconductive oxide film which was a polycrystalline substance, but in which the axis C of the oxide crystal is oriented in the vertical direction with respect to the surface of the substrate. FIG. 6 shows an X-ray diffraction pattern of this superconductive oxide film, from which the crystal orientation in this superconductive oxide film could be verified. By the way, this X-ray diffraction pattern was resulted from measurement done by use of $CuK\alpha$ as the X-ray source, wherein the ordinate represents an output, and the abscissa denotes a diffraction angle $2\theta$ (deg.). Incidentally, thickness of this superconductive oxide film was in a range of from 0.5 to 4 $\mu$m.

The superconductive property of this specimen was not very much different from the coventional superconductive oxide film, which indicated the critical temperature of 94 K. and the transition width of 4 K., but its critical current density value was 1,000 A/cm$^2$ (at 77 K.), which was approximately 10 times as high as that of conventional superconductive oxide film. With the conventional technique, there could be obtained only those superconductive oxide film of a generally polycrystalline nature having a low critical current density, owing to the anisotropy of the superconductive oxide substance. However, in this Example 6, there was obtained an oriented film having higher critical current density than that of the generally polycrystalline substance.

EXAMPLE 7

The superconductive oxide thin strap was produced in the same manner as in Example 6 above by use of YSZ polycrystalline substance and quartz glass having the surface coarseness of 9 $\mu$m or below, as the substrate, in place of the monocrystalline substrate of MgO in Example 6 above. The same favorable results could be obtained.

EXAMPLE 8

The superconductive oxide film was produced by means of the superconductive film producing device shown in FIG. 5, using the same material solution as that used in Example 1 above, and the monocrystalline substrate of $SrTiO_3$ having the surface coarseness of 9 μm or below. The conditions for the production were as follows: a flow rate of the carrier gas of 200 SCCM; the vacuum degree in the interior of the reaction chamber of 20 Torr; and an output from the plasma-generating micro-wave power source of 600 W. The superconductive film produced under these conditions by carrying out the reaction for a time period of from 1 to 4 hours was subjected to heat-treatment in the same manner as in Example 6 above. The thus obtained suerconductive oxide film was found to have its film thickness of from 0.5 to 4 μm, with its surface having been substantially of mirror surface. It was also verified that this film had been oriented by the X-ray diffraction as is the case with Example 6. The critical temperature, transition width, and critical current density were respectively 94 K., 4 K., 1,000 A/cm$^2$ (at 77 K.) all of which are favorable values for the purpose of the present invention.

By the way, when the YSZ base plate having its surface roughness of 15 μm was used, no appropriately oriented film could be obtained with consequence that the critical current density decreased to 50 A/cm$^2$ (at 77 K.).

EXAMPLE 10

Using a Hastelloy(*) substrate of polycrystalline metal alloy having the surface roughness of 9 μm[(*) a trademark for a series of high-strength nickel-base, corrosion-resistant alloys of Union Carbide Corp., U.S.A.], the superconductive oxide film was produced in the same manner as in Example 8 above, but without subecting it to the heat-treatment. The resulted superconductive oxide film indicated its critical current density of as high as 600 A/cm$^2$ (at 77 K.), in spite of its having been sujbected to no heat-treatment.

EXAMPLE 11

In order to obtain a superconductive oxide substance of $ErBa_2Cu_3O_{7-\delta}$, nitrate of each and every constituent element was weighed in such a manner that the compositional ratio of Er, Ba, and Cu might become 1:2:3. Thereafter the mixture was dissolved in water to prepare an aqueous solution having an overall concentration of 0.2 mol/ , which was made the material solution. Using this material solution and a monocrystalline substrate of MgO having its surface roughness of 9 μm or below, the superconductive oxide film was produced it the same manner as in Example 6. The thus obtained superconductive oxide film exhibited favorable values for its critical temperature, transition width, and critical current density of 45 K., 2 K., and 800 A/cm$^2$ (at 77 K.), respectively.

Incidentally, in the foregoing various examples, mention has been made as to atomizing the material solution into mists by application of supersonic wave to the solution. It may also be noted that the same effect could be obtained by spraying the material solution through small orifices of a spraying device under pressure of oxygen so as to directly spray the same into the plasma in the chemical reaction apparatus.

Also, as the material solution to be used in the present invention, there may be used aqueous solution of nitrates, sulfates, chlorides, acetates, or alkoxides containing therein a plurality of elements constituting the superconductive oxides, or mixtures of these aqueous solutions. Further, there may also be used not only these aqueous solutions, but also various solutions of organic solvents such as for example alcohol, etc. With use of these solutions, there could be obtained the superconductive oxide films having favorable superconductive property. Concentration of such material solution should appropriately be 1 mol/ or below, or more preferably from 0.01 to 0.4 mol/ , in consideration of solubility of the materials.

The substrate for use in the present invention may be obtained not only from stainless steel, molybdenum, etc., but also from other metals and ceramics such as alumina. Such substrate may not necessarily be in tape form, but it may be in fiber form or an aggregate of such fibers. For instance, when the superconductive oxide substance was adhered onto the molybdenum and alumina fibers, each having a diameter of 30 μm, under the same conditions as in Example 1 above, and then the superconductive oxide film was measured for its critical temperature, transition width, and critical current density in the state of the fibers havig been aggregated, it was found that both critical temperature and the transition width were more or less same as those of Example 1 above, but the critical current density improved as high as 20 A/cm$^2$.

Also, when obtaining the superconductive oriented film, the surface coarseness of the substrate should preferably be 9 μm or below, because such orientation is difficult to be realized with the coarseness of the substrate exceeding 9 μm. Exampls of such substrate are: monocrystalline substrate of metals or ceramics, polycrystalline substrate of ceramics, or glassy substrate of ceramics, all having their surface roughness of 9 μm or below.

The superconductive oxide substance for the purpose of the present invention may be selected from those ted by $M_1$-$M_2$-Cu-O such as those exemplified in the foregoing examples, i.e., Y-BA-Cu-O type, La-Sr-Cu-O type, Er-Ba-Cu-O type, and others. In this general formula, $M_1$ denotes the elements belonging to Group IIa in the Periodic Table, for which any one or more of Mg, Sr, Ba and Ca are selected; and $M_2$ denotes the elements belonging to Group IIIa, for which any one or more of La, Y, Yb, Sc, Ce, Pr, Sm, Ho, Er and Tm are selected.

Further, examples of the chemical reaction apparatus to be used for the method of the present invention are as follows: 1) apparatus using the excitation reaction due to oxygen-containing plasma; 2) apparatus using oxygen-containing gas or heat-oxidation reaction such as heat-decomposition CVD device, i.e., heat-decomposition or heat-oxidation reactin appartus employing a general type electric furnace.

Furthermore, the heat-treatment for the purpose of the present invention is carried out in the oxygen atmosphere or the oxygen-containing atmosphere at a heating temperature in a range of from 200° C. to 1,200° C. Below 200° C., the superconductive oxide substance is not crystallized, while, above 1,200° C., the substance starts to decompose. When the superconductive oxide substance of high critical current density is to be obtained, the heating temperature should preferably be in a range of from 600 to 1,200° C.

As has so far been described, the present invention, according to its modes of embodiment, has its effect of obtaining the superconductive oxide film of long length and excellent superconductive property, through the process steps of: atomizing into mists a solution containing therein a plurality of elements constituting the superconductive oxide substance; transporting the thus atomized mists on a carrier gas into a chemical reaction zone; and, after the chemical reaction in the chemical reaction zone, depositing the suerconductive oxide substance on a substrate in a desired shape.

Also, according to another embodiment of the present invention, it has the effect of producing the superconductive oxide film having a higher critical current density by heat-treating the superconducitve oxide substance as shaped in an oxygen-containing atmosphere at a temperature ranging from 200 to 1,200° C.

In the foregoing, there will be given the actual reaction conditions for the production of the superconductive oxide powder according to the present invention. First of all, with a view to obtaining the superconductive oxide powder of $YBa_2Cu_3O_{7-\delta}$ ($\delta$ is an integer of 0 or 1) as the end product, acetate of each and every constituent element, i.e., $(CH_3COO)_3Y$, $(CH_3COO)_2Ba$, $(CH_3COO)_2Cu$ was blended so as to be in the compositional ratio of Y:Ba:Cu=1:2:3, and the thus obtained mixture was dissolved in water to prepare an aqueous solution having an overall concentration of 0.2 mol/ , which was made the material solution. The transporting and separating gas was fed at a flow rate of 200 SCCM, and the reaction was conducted for five hours under the atmospheric pressure at a furnace temperature of from 800 to 1,000° C. After the reaction, the superconductive oxide powder according to one example of the present invention, which was collected in the trap, was separated by a centrifugal separator, follwed by drying the separated powder, whereby about 10 g of the superconductive oxide powder could be obtained at a rate of yield of 60%.

The material powder which was obtained in the same manner as mentioned in the preceding was pressed into pellets, which were then subjected to heat-treatment for sintering in the oxygen atmosphere at a temperature ranging from 900 to 1,200° C. for two hours. The superconductive pellets showed the critical temperature and the transition width of 94 K. and 4 K., which were not so much different from the conventional superconductive oxide materials. However, width regard to the critical current density, it showed a value of 1,000 A/cm$^2$ (at 77 K.), which was 10 times as high as that of the conventional superconductive oxide substance.

In the foregoing examples of the present invention, mention has been made as to the atomization of the material solution into mists by the application of supersonic wave. It may also be noted that, instead of atomization, the material solution is ejected from small orifices of a spray device under pressure of oxygen direotly into the chemical reaction device, with the same resulting effect.

Moreover, as the material solution to be used for this invention, there may be used aqueous solutions of nitrates, sulfates, chlorides, or alkoxides, or mixtures of these solutions, besides the aqueous solution of acetates containing therein mixture of various elements so as to indicate the superconductive property by the heat-treatment. In addition, use of organic solvent solutions such as alcohol, etc. could also produce the supercoductive oxdie powder having favorable superconductive property.

Besides the Y-Ba-Cu-O type superconductive oxide substances as exemplified in the foregoing, the present invention can also be applied to the production of various superconductive oxide substances represented by $M_1$-$M_2$-Cu-O (where $M_1$ denotes the elements belonging to IIa Group in the Periodic Table, for which any one or more of Mg, Sr, Ba and Ca are selected; and $M_2$ denotes the elements belonging to IIIa Group, for which any one or more of La, Y, Yb, Sc, Ce, Pr, Sm, Ho, Er and Tm are selected). As one example, the conditions for producing the Er-Ba-Cu-O type superconductive oxide substance and the superconductive property of the thus obtained specimen are shown in the following. First of all, with a view to obtaining the superconductive oxide powder of $ErBa_2Cu_3O_{7-\delta}$, nitrate of each and every constituent element was weighed so as to be in the compositional ratio of Er:Ba:Cu=1:2:3, and then the mixture was dissolved in water to prepare aqueous solution having an overall concentration of 0.2 mol/ , which was made the material solution for producing the superconductive oxide powder. This material solution was fed, in the form of atomized mists, into the reaction apparatus used in the preceding examples, to obtain the superconductive oxide powder according to other examples of the present invention, after which it was made the sintered pellets same as described above. The resulted superconductive powder had the substantially same superconductive property as that of the afore-described superconductive oxide powder.

The superconductive powder can also be collected, as another method, by causing exhaust gas to pass between polar plates, to which a high tension voltage of from 500 to 2,000 V is applied. The trap is on the same principle as the general electrostatic dust catcher. In this case, the trapping efficiency improved to 90% or higher, although the construction of the device would inevitably become large.

What is claimed is:

1. A method for producing a superconductive ternary copper oxide layer containing therein $M_1$, $M_2$, Cu and O, which comprises:

a) atomizing, into a mist, a solution comprising elements $M_1$, $M_2$, and Cu constituting said superconductive ternary copper oxide layer, wherein $M_1$ is selected from the group consisting of Mg, Sr, Ba and Ca; and $M_2$ is selected from the group consisting of La, Y, Yb, Sc, Ce, Pr, Sm, Ho, Er and Tm, said elements being contained in said solution as one or more compounds selected from the group consisting of nitrates, sulfates, chlorides, acetates and alkoxides, such that droplets having a diameter of about 2 to 5 μm are substantially formed, b) transporting said atomized mist on a carrier gas into a chemical reaction zone employing a plasma CVD device, and, after chemical reaction in said zone, c) depositing a ternary copper oxide layer on a substrate preheated to a temperature of 400°–1000° C. in a desired shape, said substrate being selected from the group consisting of alumina, stainless steel, molybdenum and $SrTiO_3$, and d) heat-treating the deposited ternary copper oxide layer in an oxygen-containing atmosphere at a temperature ranging from 200° C.–1200° C. to form said superconductive ternary copper oxide layer on said substrate.

2. The method for producing a superconductive oxide layer according to claim 1, wherein said plasma CVD device is micro-wave plasma CVD device.

* * * * *